(12) United States Patent
Rajendran et al.

(10) Patent No.: US 7,155,075 B2
(45) Date of Patent: Dec. 26, 2006

(54) OPTICAL BATTERY TEMPERATURE MONITORING SYSTEM AND METHOD

(75) Inventors: Veera Palanivelu Rajendran, Niskayuna, NY (US); Robert Dean King, Schenectady, NY (US); Timothy Gerard Richter, Wynantskill, NY (US); Lembit Salasoo, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 104 days.

(21) Appl. No.: 10/812,215

(22) Filed: Mar. 29, 2004

(65) Prior Publication Data
US 2005/0213867 A1    Sep. 29, 2005

(51) Int. Cl.
*G02B 6/00* (2006.01)
*H02J 7/00* (2006.01)

(52) U.S. Cl. ......................................... 385/12; 320/150

(58) Field of Classification Search .................. 385/12, 385/37, 13; 320/150, 153
See application file for complete search history.

(56) References Cited
U.S. PATENT DOCUMENTS

| | | | |
|---|---|---|---|
| 4,417,782 A | 11/1983 | Clarke et al. ............ 350/96.29 |
| 5,079,716 A | 1/1992 | Lenhardt et al. ............ 364/483 |
| 6,160,383 A * | 12/2000 | Carkner ...................... 320/150 |
| 6,232,748 B1 | 5/2001 | Kinoshita ................... 320/132 |
| 6,621,947 B1 | 9/2003 | Tapanes et al. ............... 385/12 |
| 2001/0022804 A1* | 9/2001 | Helmig et al. .............. 374/161 |

FOREIGN PATENT DOCUMENTS

WO    WO9941819    8/1999

* cited by examiner

*Primary Examiner*—Sarah Song
(74) *Attorney, Agent, or Firm*—Fletcher Yoder

(57) ABSTRACT

Several methods for measuring and monitoring temperature have been presented for systems requiring temperature monitoring. In one implementation, the system has been applied to battery assemblies. Temperature measurements for every part of the battery assembly are disclosed. In one aspect the surface temperature of a battery assembly is measured. In another aspect, the internal temperature of the battery assembly is measured. In other aspects, the internal and external temperatures of several battery assemblies are measured. Based on the measured temperature, control signals are generated by a control system to switch down the power of the battery charging system so as to prevent excess heat generation.

11 Claims, 3 Drawing Sheets

OPTICAL BATTERY TEMPERATURE MONITORING SYSTEM AND METHOD

BACKGROUND

The invention relates generally to monitoring and control systems and more particularly to a method and system for monitoring a temperature of batteries.

A wide variety of applications employ batteries and battery banks for operation. These range from mobile applications to consumer uses to industrial applications, to mention just a few. Vehicle and other mobile applications, for example, commonly use one or more batteries either for starting and auxiliary functions, or for a primary or secondary source of power for normal operation. In recent years, for example, electrical vehicles and hybrid electrical/engine driven vehicles have become the focus of intense development activities. Such vehicles represent a demanding environment in which battery performance and life are important to the continued reliable operation of the vehicular systems.

Battery systems used in many applications, such as electrical and hybrid vehicles, may contain many battery modules, each further containing one or more individual batteries. These batteries individually may have low voltages, of about 1.2 volts. However, in applications such as in hybrid vehicles, where the battery systems contain a large number of individual batteries, the voltage gradient is very high. Moreover, in hybrid vehicles, high-energy density batteries are used, which typically charge and discharge rapidly. These new modes of operation subject the batteries to higher electrical loads. Consequently, thermal management of battery systems becomes a critical issue. In addition, for cooling the battery systems, an effective temperature measurement scheme is needed. Therefore, it is desirable to have a temperature profile, for proper control and corrective actions to be taken.

Current battery temperature measurement schemes generally include ways to measure temperature outside the vehicle battery and within it. As is well known,

BACKGROUND

The invention relates generally to monitoring and control systems and more particularly to a method and system for monitoring a temperature of batteries.

A wide variety of applications employ batteries and battery banks for operation. These range from mobile applications to consumer uses to industrial applications, to mention just a few. Vehicle and other mobile applications, for example, commonly use one or more batteries either for starting and auxiliary functions, or for a primary or secondary source of power for normal operation. In recent years, for example, electrical vehicles and hybrid electrical/engine driven vehicles have become the focus of intense development activities. Such vehicles represent a demanding environment in which battery performance and life are important to the continued reliable operation of the vehicular systems.

Battery systems used in many applications, such as electrical and hybrid vehicles, may contain many battery modules, each further containing one or more individual batteries. These batteries individually may have low voltages, of about 1.2 volts. However, in applications such as in hybrid vehicles, where the battery systems contain a large number of individual batteries, the voltage gradient is very high. Moreover, in hybrid vehicles, high-energy density batteries are used, which typically charge and discharge rapidly. These new modes of operation subject the batteries to higher electrical loads. Consequently, thermal management of battery systems becomes a critical issue. In addition, for cooling the battery systems, an effective temperature measurement scheme is needed. Therefore, it is desirable to have a temperature profile, for proper control and corrective actions to be taken.

Current battery temperature measurement schemes generally include ways to measure temperature outside the vehicle battery and within it. As is well known, measurement techniques involve measuring the vehicle battery temperature using thermocouple sensors and "temperature dependent resistor" or "resistance temperature device", also referred to as an "RTD".

One disadvantage of RTDs is that, a suitable electrical power supply is required for its operation. A small change in the current or voltage of the power supply may cause an erroneous measurement of the temperature. Similarly, thermocouples also operate using power supplies and are also susceptible to any kind of electrical interference.

One method to overcome the problem of electrical interference is to use fewer RTDs or thermocouple sensors to measure the temperature of batteries. However, such a scheme would provide only a limited temperature profile of the battery system.

Other measurement schemes involve measuring temperatures of the battery system indirectly by measuring the temperature of the vehicle motor and the environmental temperature. However, these do not give the true temperature of the battery system. Temperature sensing integrated circuit chips have also been employed to measure the temperature. These chips exhibit a proportional increase in voltage signal outputted with the increase in temperature. Again, these have the limitation of being able to measure only the external temperature.

It would therefore be desirable to obtain true temperature measurement of the battery system. Also desirable would be a detailed temperature profile in order to efficiently monitor and control the battery systems.

BRIEF DESCRIPTION

Briefly, in accordance with one aspect of the invention, a system for measuring and monitoring temperature of a battery assembly is provided. The system includes an optical cable with sensors, in a distributed configuration, for measuring the temperature of the battery assembly. Battery temperature monitoring circuitry monitors the measured temperature signal.

In accordance with another aspect of the invention, the internal temperature of the battery system is measured and monitored. In other aspects of the invention, internal temperature of a plurality of battery systems may be measured and monitored. The charging of the battery system may also be controlled based on the monitored temperature.

DRAWINGS

The foregoing and other advantages and features of the invention will become apparent upon reading the following detailed description and upon reference to the drawings in which.

DETAILED DESCRIPTION

Figure 1:
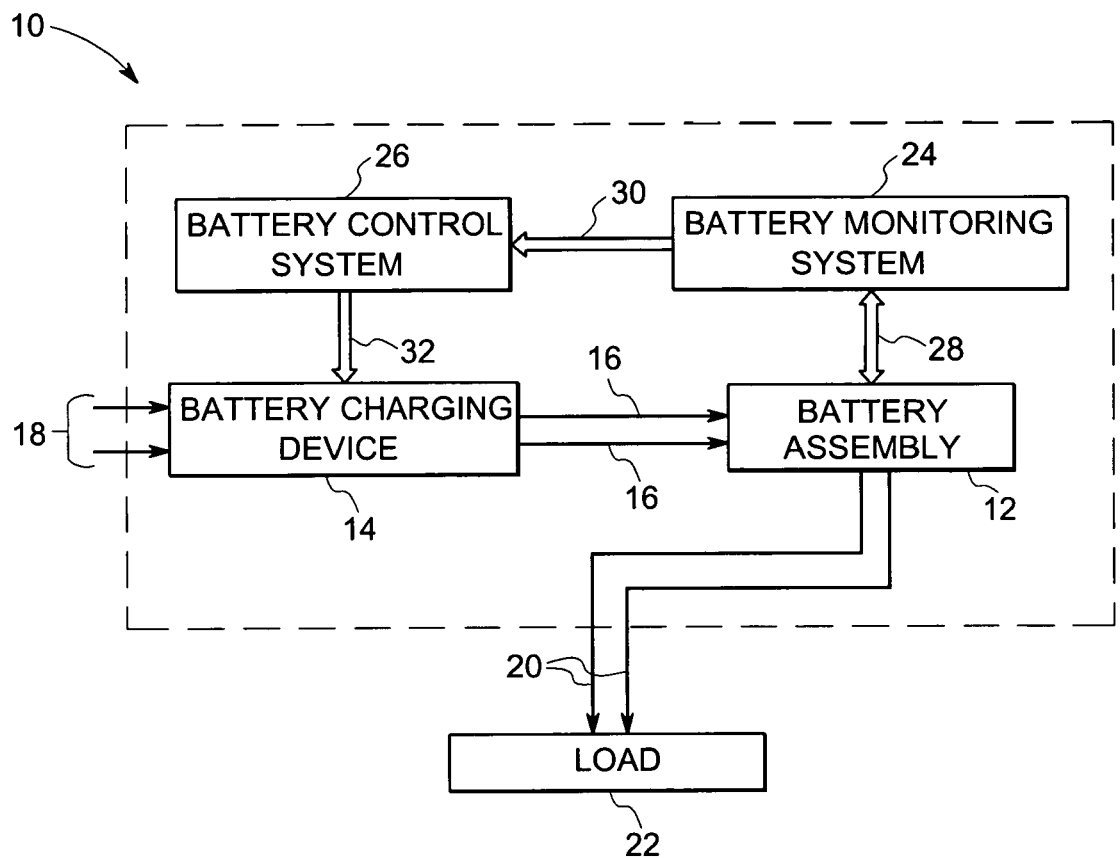
FIG. 1 is a diagrammatical view of an exemplary battery monitoring and control system in accordance with aspects of the present technique.

FIG. 1 is a diagrammatical view of an exemplary battery temperature monitoring and control system, designated generally by numeral 10. The system 10 of FIG. 1 is adapted to obtain a temperature profile of a battery assembly 12, and optionally, to control the battery charging mechanism based on the measured temperature. The battery assembly 12 as illustrated in FIG. 1 contains several individual cells.

A battery charging device 14 charges the battery assembly 12, via leads 16. The batter charging device 14, itself, received power from an external source, such as via leads 18. The battery assembly 12 is also coupled to leads 20, and thereby, to a load 22 by leads 20. The load could be any system utilizing high capacity battery power supply. The battery assembly 12 is furthermore coupled to a battery monitoring system 24 that monitors the temperature of individual cells or locations in the battery assembly 12. Where desired, and as shown in FIG. 1, the battery monitoring system 24 may, in turn, be coupled to additional control or monitoring circuitry, both within and external to the system 10, such as to a battery control device 26. Signals are transmitted to and from the battery monitoring system 24 via appropriate signal cabling, indicated by reference numerals 28 and 30 in FIG. 1. The battery control device 26, based on the temperature of the battery assembly, may serve to switch or modulate the power to the charging device 14, for example. Control signals for this purpose may be transmitted via appropriate cabling, as represented generally at reference numeral 32.

In a presently contemplated embodiment, the load 22 includes systems of a hybrid vehicle. It will be appreciated by those skilled in the art that the applications of the system are not limited to hybrid vehicles, or to any particular battery or power system. For example, the system may be applied to an inverter power supply used for domestic and industrial purposes. Other areas of the applications include uninterrupted power supplies, generator systems, motors, marine alternators, shore power charging systems, and aircraft engines. However, the system and method of the present invention may not be limited to the aforementioned applications only, it can be applied to other areas where temperature measurement and monitoring may be usefully conducted.

The system of FIG. 1 may operate generally as follows. The battery control device 26 sends control signals through cabling 32, based on the temperature of the battery assembly, to the battery charging device 14. The control signals include data for modulating the battery charging mechanism. As will be appreciated by those skilled in the art, if the battery is continuously charged, the battery temperature may reach undesirably high levels, which may affect battery performance and life. In the present technique, battery charging may be switched off or otherwise modulated (i.e. according to a desired charging regime) when the battery temperature exceeds a threshold level. The charging may be resumed, or follow a different regime, when the temperature is controlled or reduced to a permissible level.

The systems, devices and components of system 10 shown in FIG. 1 may include a range of hardware and software. For example, the battery monitoring system 24 may include both analog and digital components, as described in greater detail below. The battery control system 26 may similarly include analog and digital components, and may be based upon one or more dedicated processors that receive the temperature data from the monitoring system 24, such as in digital form. The battery control system 26 may be a separate system, or may be incorporated in systems designed for expanded control, such as for vehicle controls when the system is incorporated into a vehicle. Similarly, the battery charging device 14 may be a power electronic device, or a driven system, such as an alternator or generator system.

Figure 2:
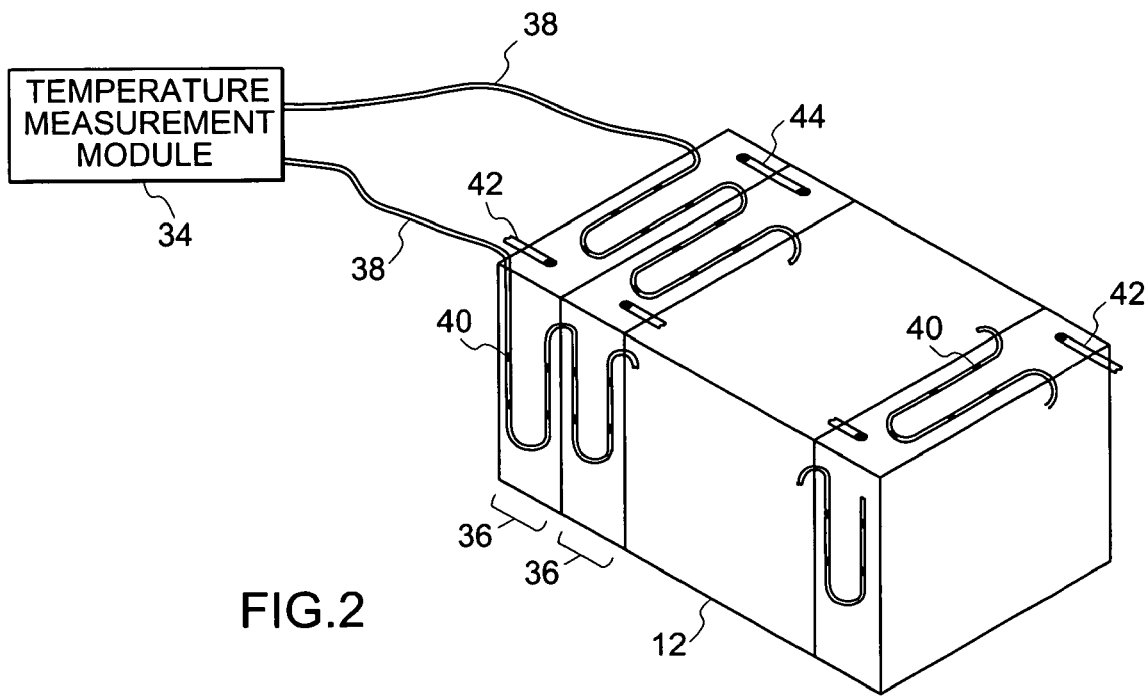
FIG. 2 illustrates an exemplary physical implementation of a battery system along with a temperature measurement module in accordance with the system of FIG. 1, illustrating one approach to measuring the surface temperature of the battery assembly, in which an optical temperature monitoring cable takes a serpentine path along the surface of the battery assembly.

FIG. 2 illustrates one exemplary physical implementation of the battery system 12 along with a temperature measurement module 34 incorporated into the battery temperature monitoring system 24. The temperature measurement module 34 may include all or only some of the circuitry and components of the system described above with reference to FIG. 1. In the implementation illustrated in FIG. 2, the battery system 12 includes a series of individual cells 36, the temperature of which are to be monitored. FIG. 2, then illustrates one approach to measuring the surface temperature of the battery assembly 12, in which the optical temperature monitoring cable 38 takes a serpentine path along the surface of the battery assembly 12.

In accordance with aspects of the present techniques, an optical cable 38 is provided for measuring the surface temperature of the battery assembly 12. In one embodiment, the optical cable 38 comprises Bragg grating sensors 40 etched into or onto the cable. Presently contemplated methods for measurement of battery system temperature via such optical cables include optical frequency domain reflectometry (OFDR), optical time domain reflectometry (OTDR), or optical coherence domain reflectometry (OCDR). The OFDR technique as applied to the system of FIG. 1 and the implementation of FIG. 2 is explained in greater detail below.

In the physical implementation of FIG. 2, the battery system is coupled to external circuitry via electrodes 42. Individual cells 36 are coupled together by connectors 44 to form the battery assembly 12. The electrodes 42 of the cells at the end are coupled to the load, and to any charging circuitry, such as by leads 20 shown in FIG. 1. It should be noted that, in the embodiment of FIG. 2, the optical cable 38 containing the Bragg grating sensors 40 is disposed on the surface of the battery assembly in a serpentine path, so as to cover each area of the battery assembly for which temperature monitoring is desired.

In one contemplated embodiment, the optical cable 38 covers each of the individual cells 36, such that a plurality of sensors 40 are present on the surface of each individual cells 36. The sensors may be very closely spaced along the cable 38, such that many sensors may generate temperature signals at desired locations. For example, the sensors 40 may be spaced at every 6.2 mm in the optical cable 38 in one embodiment. More generally, the spacing may be in the range of 5 mm to 10 mm. Typically, with more sensors, a more detailed temperature profile can be provided. In a presently contemplated implementation, the distance between the sensors is at least 0.2 mm to prevent erroneous temperature measurements. Other spacings may, of course be envisaged.

Moreover, as described below, the sensors may each generate a temperature signal that is monitored or not monitored. That is, cable 38 may be fabricated to include sensors 40 at predetermined spaced locations, with only certain sensor output signals being monitored, and others ignored. Similarly, where sensor spacing permits (e.g. relatively tightly spaced sensor positions), signals from multiple sensors may be added, averaged, or otherwise processed to provide the desired indication of temperature.

In a presently contemplated embodiment, the temperature measurement module 34, which resides in the battery monitoring system 24, transmits laser signals via optical cable 38. Each sensor 40 returns a signal representative of the measured temperature and the location of the sensor. Therefore, the temperature monitoring system, at any given time, records information of the exact temperature at each location.

Figure 3:
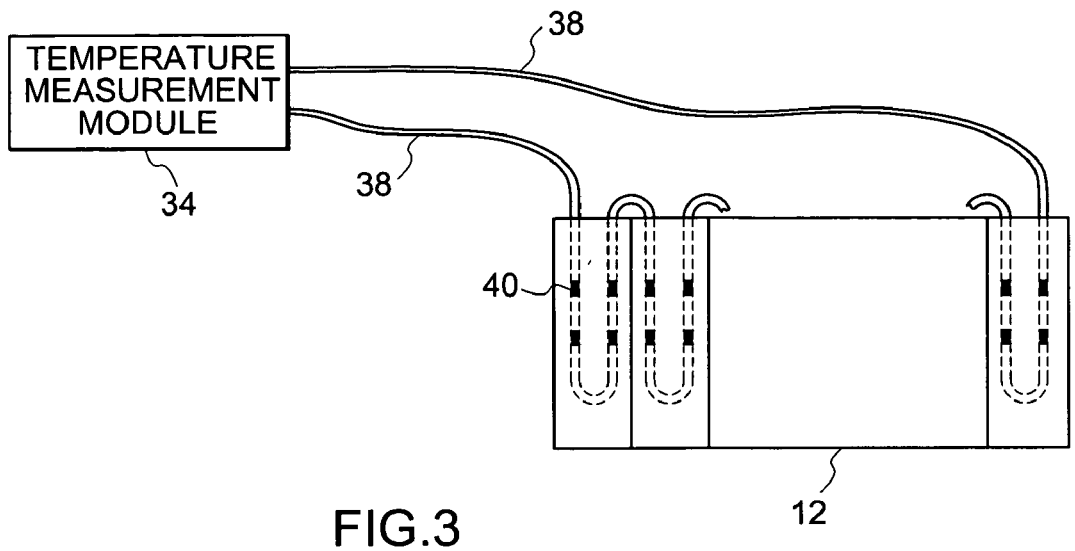
FIG. 3 illustrates another exemplary approach to monitoring temperature of a battery assembly in which the optical temperature monitoring cable runs into the individual battery cells.

FIG. 3 represents, another exemplary approach to monitoring temperature of the battery assembly 12. In this embodiment, the optical cable 38 passes through the electrolyte of the individual cells 36, such that each individual cell 36 has a plurality of sensors 40 therein. Thus, the true temperature of the space within the cells, which includes the temperature of the electrolyte and the electrodes, can be measured. The sensors detect and send the temperature and location information to the temperature measurement module 34. The present technique, through the use of optical temperature detection, provides a system that is relatively immune to harsh sensing environments that can destroy other sensors, including the acidic or corrosive environments in and around the battery system.

Figure 4:
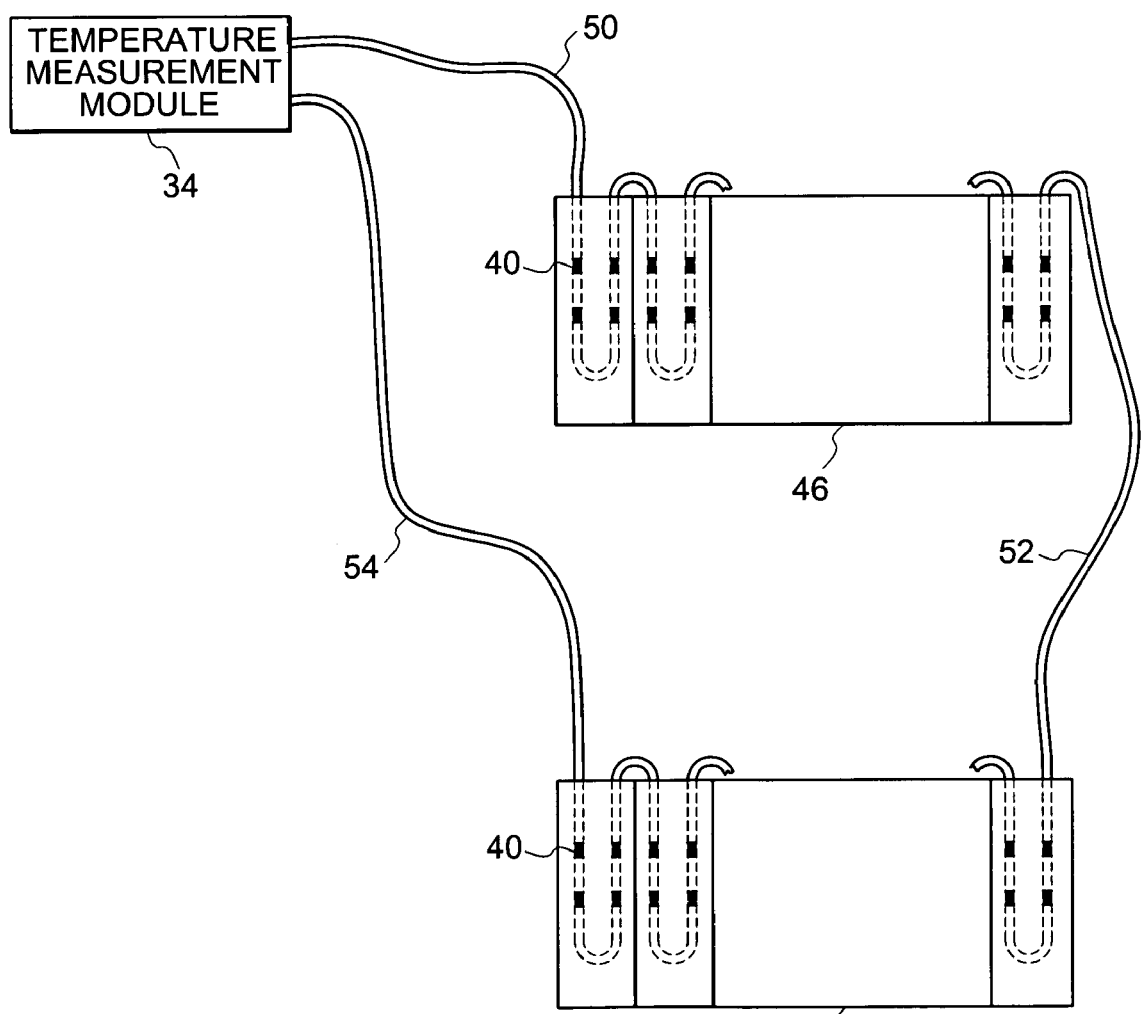
FIG. 4 illustrates yet another exemplary approach to monitoring temperature of a battery assembly in which the optical temperature monitoring cable runs into individual battery cells of two different battery assemblies or groups.

FIG. 4 illustrates another embodiment of the present invention. In this embodiment, the temperature monitoring system 34 monitors two different battery assemblies, 46 and 48. As shown in the figure, the optical cable couples two battery assemblies. In particular, several segments of such cabling are shown in FIG. 4, including a first segment 50 linking battery assembly 46 to the temperature measurement module, a second segment 52 linking the assemblies 46 and 48 to one another, and a third segment 54 linking the second assembly 48 to the temperature measurement module. The segments will typically provide continuity for the optical signals transmitted, thereby permitting monitoring of battery assemblies via a single measurement module. It will be appreciated by those skilled in the art that a plurality of such battery assemblies may be monitored in a similar manner. The temperature measurement module 34 can be configured to measure the temperature of any one of the battery assemblies. Moreover, the system can provide data on temperatures of individual cells or even locations in the assemblies, such as for determining which individual cell of which assembly may be exceeding the threshold level. Similarly, the system can be implemented for measuring surface temperature of a plurality of battery assemblies. The technique thus provides a powerful tool in evaluating, troubleshooting, and servicing battery systems based upon temperature measurements.

Figure 5:
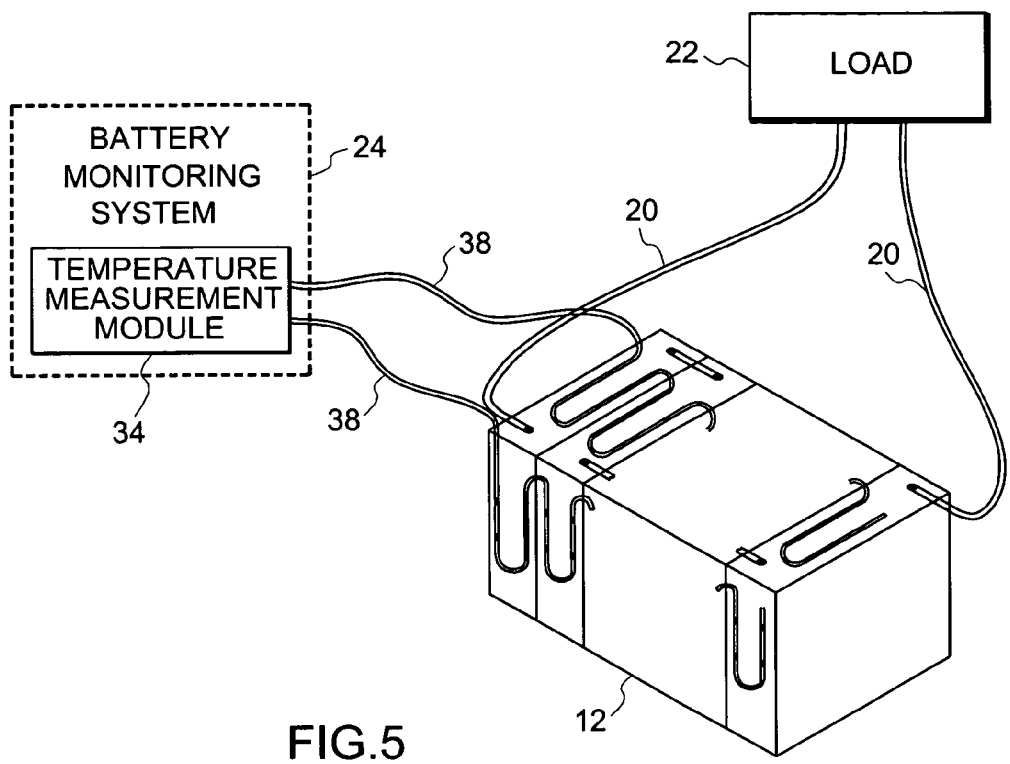
FIG. 5 is the diagrammatical illustration of an exemplary battery temperature monitoring and control system shown generally in the previous figures; and, FIG. 6 is diagrammatical illustration of an exemplary temperature measurement circuit for a module of the type shown in the previous figures, illustrating the signal flow path during monitoring of temperature of the battery system.

FIG. 5 is the diagrammatical illustration of an exemplary battery temperature monitoring and control system 10. The battery assembly 12 is coupled to the load 22 by leads 20. The battery monitoring system 24 includes the temperature measurement module 34 and is coupled to the battery assembly 12 by means of optical cable 38. The temperature measurement module 34 measures the temperature. As mentioned above, the battery monitoring system thus may receive signals containing information of the location and temperature of each area of the battery assembly 12 being monitored. The system may thus measure, monitor and control temperatures of the battery system, or even of components of the battery system during actual operation (i.e., while coupled to the load).

Figure 6:
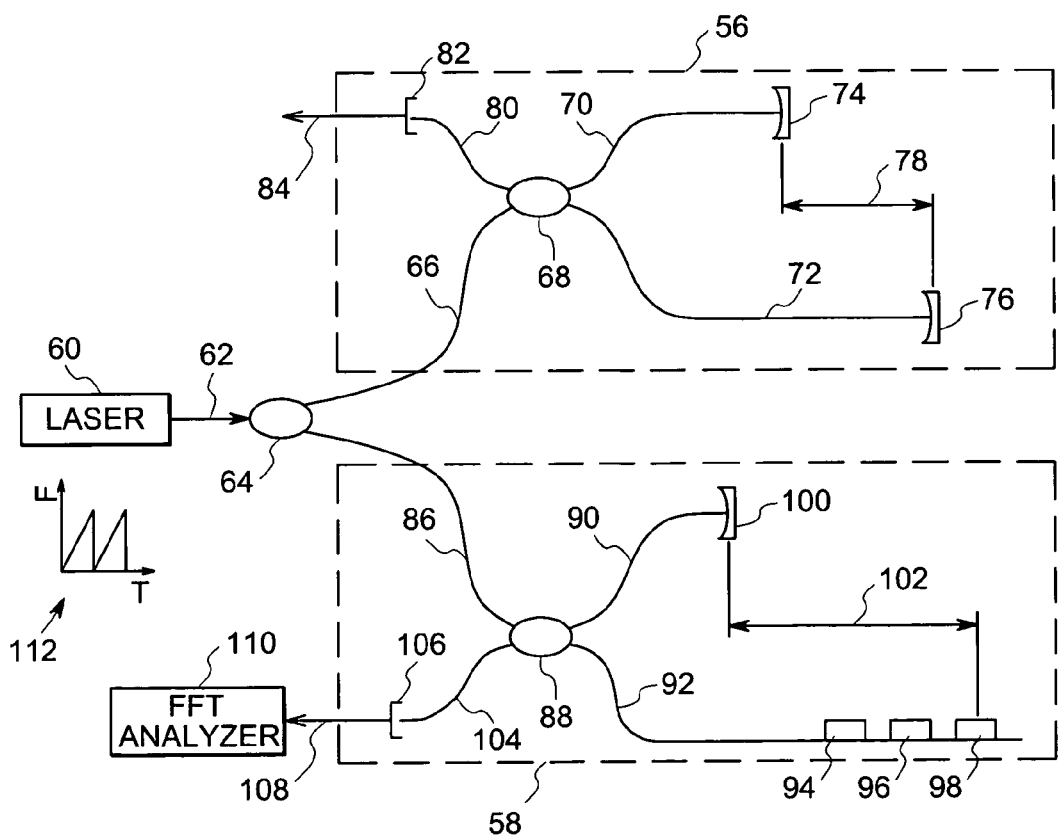

FIG. 6 illustrates an exemplary temperature measurement circuit for the module described above. In this exemplary implementation, the temperature measurement circuit comprises a reference interferometer 56 and a measurement interferometer 58. Each of these interferometers comprises fiber optic cables, fiber optic couplers, reflectors, and detectors. The optical cable has a diameter of 100 μm, which consists of a cladding disposed outside the glass surface of the fiber. The fiber with embedded sensors is contained within a sheath, which is made of polyamide material. The sheath permits mutual movement between the fiber and the location within which the cable is installed. The range of temperatures that can be measured will typically depend upon such factors as the material of the cladding. In the presently contemplated embodiments, the maximum temperature that can be measured is 200° C. By changing the material of the cladding however, higher temperatures can also be measured.

In one exemplary embodiment, an optical frequency domain reflectometry technique is utilized to measure the temperature of an area, and to provide the location at which the temperature measurement data originated. The circuitry for this embodiment is also is illustrated in FIG. 6. A laser triggering device 60 triggers the interferometers by sending a continuous laser signal varying in frequency, as represented by inset 112, through optical cable 62. A fiber optic coupler 64 splits the laser signal so that one part is sent to the reference interferometer 56, while the other is sent to the measurement interferometer 58. The laser signal entering the reference interferometer 56 is again split into two by the fiber optic coupler 68. A portion of this split laser signal is transmitted, via optical cable 70, to a reflector 74. The second portion of the split laser signal is transmitted, via optical cable 72, to another reflector 76, which is positioned at a fixed length (L) 78 from reflector 74. The laser signals reflect from reflectors 74 and 76, and are directed by the fiber optic coupler 68, via cable 80, to a reference detector 82. An interferometric pattern is created at detector 82, which is a function of the fixed length (L) 78, the refractive index of the fiber (η), and the wave number (k). The value of the wave number can be computed from the relationship:

$$k = 2\Pi/\lambda,$$

where λ is the wavelength of the laser signal. Therefore, the signal received at detector 82 is effectively a function of wavelength (λ). The signal received at detector 82 is cyclic.

Similarly, the second portion of the laser signal from coupler 64 is transmitted to the measurement interferometer. The laser signal is again split at coupler 88 into two portions, one of which reaches reflector 100 through cable 90, while the other portion passes through the cable 92 and encounters a Bragg grating sensor 94 (corresponding to one of sensors 40 discussed above). The Bragg grating sensor is a structure etched into the core of the optical fiber, such as during the fiber draw process. These sensors, as described earlier, are spaced at a desired distance along the cable, such as at regular spacings of 6.2 mm in the exemplary embodiment. Because the refractive index of the Bragg grating sensor is different from the fiber glass, the frequency of the light passing through the grating is altered. Thus the wavelength of the light is changed. As mentioned above, many such sensors will typically be etched in the fiber. The signal received by a measurement detector 106, then, is a function of the distance (L1) 102 between the reflector 100 and the sensor 94, the refractive index of the grating ($\eta$1), and the wave number (k1). Similarly, the signal received at detector 106 with respect to a different sensor 96 depends on the distance (L2) 102 of the reflector 100 from the sensor 96, the refractive index of the grating ($\eta$2), and the wave number (k2).

The amplitude of the measurement signals received by detector 106 from the overlapping interferometers is beat with the amplitude of the reference signal received at detector 82. Thus the sinusoidal measurement signals of the measurement interferometer 58 are compared with the sinusoidal reference signal of the reference interferometer 56. If the signals are constructive, they augment each other and a beat frequency is produced, whereas if the signals are destructive, the signals cancel each other so that no beat frequency is produced. The inverse of the beat frequency is called beat wave number. A fast Fourier transform (FFT) of the beat wave number provides data on the distance of the sensor from a reference location. Therefore, each sensor is identifiable by its distance from the detector 106, and hence its exact location can be determined. Another reverse FFT of the beat wave number provides a peak of the shifted wavelength. The shift in wavelength is indicative of the temperature. Such a system can be custom built to suit the needs of the measurement system. One such optical measurement kit is commercially available from Luna Innovations of Blacksburg, Va.

Those skilled in the art will appreciate that other optical temperature sensing techniques, such as OTDR and OCDR can also be utilized to measure the temperature in the present context. Also a Fabry-Perot interferometer can be utilized to achieve the desired temperature measurement results.

By virtue of the present techniques described above, the temperature of the electrolyte, electrodes, battery terminals, bus bars attached to the battery terminals, external temperature of the battery system, and internal cell temperature, can be readily measured and monitored. Similarly, mean temperature of the battery assembly may also be computed by the monitoring system or associated data processing circuitry. The control system may also be utilized to control the discharging of the battery power in order to control the battery temperature. This can be achieved in the same manner as the controlling of the battery charging mechanism. Similarly, auxiliary systems, such as chargers, generators, alternators and so forth may be similarly controlled. Moreover, indications of temperature may be provided to operations or maintenance personnel, alarms based on the sensed temperature may be provided, or any desired processing based on the temperature may be afforded in accordance with the present techniques.

While the teachings of the invention may be applied to various modified systems and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the claims appended below.

The invention claimed is:

1. A temperature monitoring system configured for measuring temperature of a battery assembly, the temperature monitoring system comprising:
   at least one optical temperature sensor disposed inside the battery assembly configured for measuring the temperature of at least one portion of the battery assembly and generating a measured temperature signal representative thereof;
   an optical cable coupled to the sensor and configured for transmitting the measured temperature signal;
   battery temperature monitoring circuitry coupled to the cable and, configured for monitoring the measured temperature signal from the at least one portion of the battery assembly;
   battery temperature control circuitry coupled to the battery temperature monitoring circuitry and configured to generate a control signal based upon the measured temperature signal; and
   a battery charging device coupled to the battery temperature control circuitry and configured for charging the battery assembly based on the control signal.

2. The temperature monitoring system of claim 1, wherein the battery assembly comprises a plurality of battery modules, wherein each battery module further comprises a plurality of batteries, the battery temperature monitoring circuitry being configured to monitor temperature of at least two battery modules or the batteries.

3. The temperature monitoring system of claim 1, the optical temperature sensor comprising a Bragg grating structure etched onto an optical fiber.

4. The temperature monitoring system of claim 1, wherein the battery temperature monitoring circuitry comprises:
   a laser modulation device configured for generating a laser trigger signal;
   reference circuitry configured for generating a reference signal;
   measurement circuitry configured for providing at least one measurement signal of at least the portion of the battery assembly; and
   a plurality of fiber optic couplers configured for splitting the laser trigger signal, the fiber optic couplers coupling the laser modulation device to the reference circuitry and the measurement circuitry.

5. The temperature monitoring system of claim 4, wherein the measurement signal comprises a temperature measurement and a location indicator.

6. A method for monitoring temperature of a battery assembly, the method comprising:
   optically measuring temperature of at least one portion of the battery assembly via an optical temperature sensor disposed inside the battery assembly;
   transmitting a signal representative of the measured temperature; and
   monitoring the temperature signal; and
   controlling a charge in the battery assembly based on a monitored temperature.

7. The method of claim 6, wherein the step of monitoring comprises
   generating a laser trigger signal and a reference signal;
   generating a plurality of measurement signals based on the measured temperature;

generating a control signal based on the reference signal and the measurement signals for controlling of the charge in the battery assembly.

8. An optical temperature monitoring and control system configured for measuring temperature of a battery assembly, the temperature monitoring system comprising:

an optical temperature sensor assembly disposed inside the battery assembly comprising a plurality of sensors configured for measuring the temperature of at least one portion of the battery assembly; wherein the battery assembly comprises a plurality of battery modules, wherein each battery module further comprises a plurality of batteries;

an optical cable coupled to the sensor assembly configured for transmitting a signal representative of the measured temperature;

battery temperature monitoring circuitry coupled to the sensor assembly and configured for monitoring the measured temperature of the portion of the battery assembly;

battery temperature control circuitry coupled to the battery temperature monitoring circuitry and configured for generating a control signal based on the measured temperature; and a battery charging device coupled to the battery temperature control circuitry, configured for charging the battery assembly based on the control signal.

9. The optical temperature monitoring and control system of claim 8, wherein the optical temperature sensors comprise a Bragg grating etched onto the optical fiber.

10. A method for optically monitoring temperature and controlling the charging of a battery assembly, the method comprising:

optically measuring temperature of at least one portion of the battery assembly via an optical temperature sensor disposed inside the battery assembly;

transmitting a signal representative of the measured temperature;

monitoring the temperature of the portion of the battery assembly via the signal; and controlling a charge in the battery assembly based on the measured temperature.

11. A system for monitoring temperature of a battery assembly, the system comprising:

means for optically measuring temperature of at least one portion of the battery assembly via an optical temperature sensor disposed inside the battery assembly;

means for transmitting a signal representative of the measured temperature;

means for monitoring the temperature of the portion of the battery assembly via the signal; and means for controlling a charge in the battery assembly based on the measured temperature.

* * * * *